United States Patent
Blondin et al.

(10) Patent No.: US 9,545,006 B1
(45) Date of Patent: Jan. 10, 2017

(54) CONFIGURABLE SYSTEM BOARD

(71) Applicant: EMC Corporation, Hopkinton, MA (US)

(72) Inventors: John Blondin, Hopkinton, MA (US); Ralph C. Frangioso, Franklin, MA (US); Joseph P. King, Jr., Sterling, MA (US); Stephen E. Strickland, Foxborough, MA (US); David C. Bisbee, Princeton, MA (US)

(73) Assignee: EMC IP Holding Company LLC, Hopkinton, MA (US)

( * ) Notice: Subject to any disclaimer, the term of this patent is extended or adjusted under 35 U.S.C. 154(b) by 341 days.

(21) Appl. No.: 14/042,470

(22) Filed: Sep. 30, 2013

(51) Int. Cl.
*H05K 1/18* (2006.01)

(52) U.S. Cl.
CPC ............................ *H05K 1/18* (2013.01)

(58) Field of Classification Search
CPC ............................................... H05K 1/18
USPC ............................................... 361/793
See application file for complete search history.

(56) References Cited

U.S. PATENT DOCUMENTS

| | | | |
|---|---|---|---|
| 5,787,014 A * | 7/1998 | Hall ................... | G05F 3/16 323/281 |
| 8,292,647 B1 | 10/2012 | McGrath et al. | |
| 8,892,911 B2 | 11/2014 | Makley et al. | |
| 2007/0090517 A1 * | 4/2007 | Moon ................. | H01L 23/3128 257/706 |
| 2008/0162963 A1 * | 7/2008 | Kung .................. | G06F 1/32 713/320 |
| 2008/0169797 A1 * | 7/2008 | Zambetti ............ | H02M 3/1584 323/285 |
| 2009/0267578 A1 * | 10/2009 | Luo .................... | H02J 1/102 323/272 |
| 2009/0296360 A1 * | 12/2009 | Doblar ................ | H05K 7/1061 361/767 |
| 2009/0313485 A1 | 12/2009 | Huang | |
| 2013/0082764 A1 * | 4/2013 | Penzes ................ | G11C 29/56 327/540 |
| 2013/0249394 A1 * | 9/2013 | Fay ..................... | B60Q 1/0088 315/77 |
| 2014/0082381 A1 | 3/2014 | Dinh et al. | |

OTHER PUBLICATIONS

Non-Final Office Action issued on May 21, 2015 in related U.S. Appl. No. 14/042,488.
Final Office Action issued on Nov. 3, 2015 in related U.S. Appl. No. 14/042,488.
Non-Final Office Action issued in counterpart U.S. Appl. No. 14/042,488 on May 4, 2016.
Final Office Action issued in related U.S. Appl. No. 14/042,488 on Nov. 25, 2016.

\* cited by examiner

*Primary Examiner* — Eric Thomas
*Assistant Examiner* — Michael P McFadden
(74) *Attorney, Agent, or Firm* — Brian J. Colandreo; Mark H. Whittenberger; Holland & Knight LLP

(57) ABSTRACT

A system board includes at least one microprocessor coupled to the system board. A first circuit board region is populated with a first model voltage regulator circuit. The first model voltage regulator circuit is configured to provide electrical power to the at least one microprocessor. A second circuit board region is unpopulated and configured to receive a second model voltage regulator circuit.

20 Claims, 3 Drawing Sheets

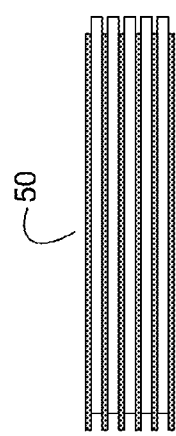
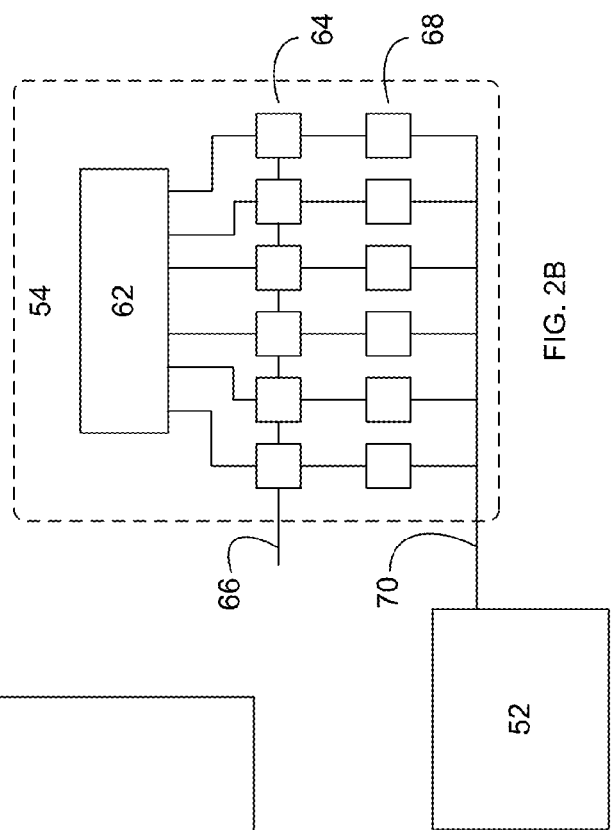
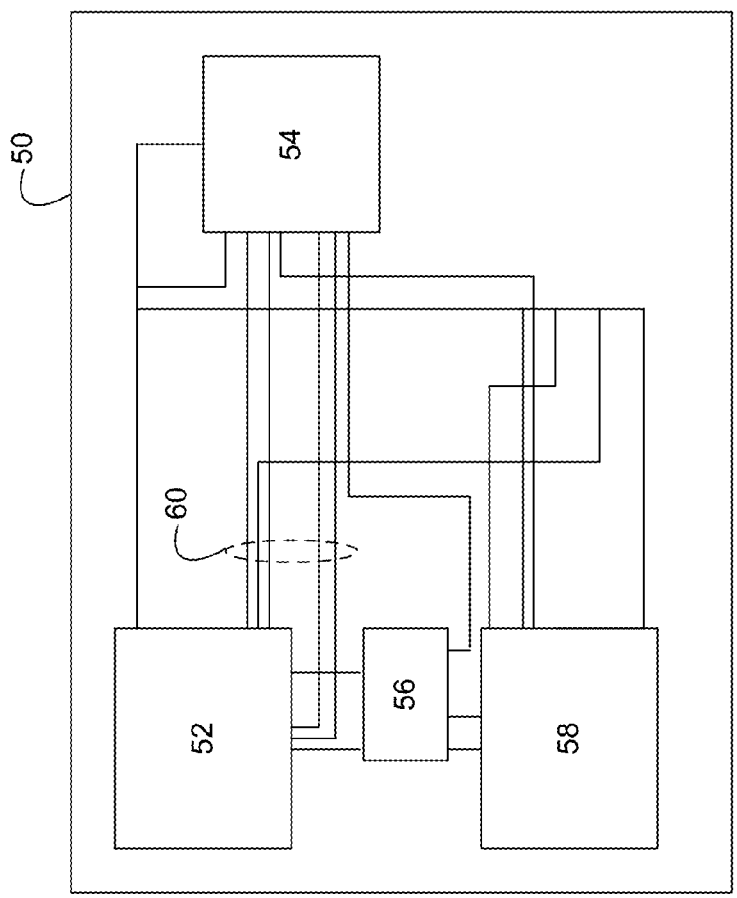

US 9,545,006 B1

CONFIGURABLE SYSTEM BOARD

TECHNICAL FIELD

This disclosure relates to system boards and, more particularly, to configurable system boards.

BACKGROUND

In today's IT infrastructure, high availability is of paramount importance. Specifically, critical (and sometimes non-critical) components within an IT infrastructure are often layered in redundancy. For example, primary servers may be supported by backup servers; primary switches may be supported by backup switches; primary power supplies may be supported by backup power supplies; and primary storage systems may be supported by backup storage systems.

When designing such high availability devices, extensive testing may be performed to ensure their functionality and reliability. Accordingly, in the event that a specific component in one of these high availability devices (such as a processor or a voltage regulator circuit) becomes unavailable, the high availability device will need to be redesigned. For example, if a specific circuit on a system board is no longer available and needs to be replaced with a suitable substitute, to accommodate such a change, the system board may need to be rerouted and the completed system may need to be extensively tested to ensure its functionality and reliability.

SUMMARY OF DISCLOSURE

In one implementation, a system board includes at least one microprocessor coupled to the system board. A first circuit board region is populated with a first model voltage regulator circuit. The first model voltage regulator circuit is configured to provide electrical power to the at least one microprocessor. A second circuit board region is unpopulated and configured to receive a second model voltage regulator circuit.

One or more of the following features may be included. The first model voltage regulator circuit may be a first multi-phase voltage regulator circuit. The first multi-phase voltage regulator circuit may include a plurality of transistors and a plurality of capacitors. The second model voltage regulator circuit may be a second multi-phase voltage regulator circuit. The second multi-phase voltage regulator circuit may include a plurality of transistors and a plurality of capacitors. The first model voltage regulator circuit and the second model voltage regulator circuit may be produced by different manufacturers. The first circuit board region may include a first solder pad array configured to electrically couple the first model voltage regulator circuit to the system board. The second circuit board region may include a second solder pad array configured to electrically couple the second model voltage regulator circuit to the system board. The system board may be configured for use in a high availability storage system.

In another implementation, a system board includes at least one microprocessor coupled to the system board. A first circuit board region is populated with a first multi-phase voltage regulator circuit, wherein the first multi-phase voltage regulator circuit is configured to provide electrical power to the at least one microprocessor. A second circuit board region is unpopulated and configured to receive a second multi-phase voltage regulator circuit.

One or more of the following features may be included. The first multi-phase voltage regulator circuit may include a plurality of transistors and a plurality of capacitors. The second multi-phase voltage regulator circuit may include a plurality of transistors and a plurality of capacitors. The first multi-phase voltage regulator circuit and the second multi-phase voltage regulator circuit may be produced by different manufacturers. The first circuit board region may include a first solder pad array configured to electrically couple the first multi-phase voltage regulator circuit to the system board. The second circuit board region may include a second solder pad array configured to electrically couple the second multi-phase voltage regulator circuit to the system board. The system board may be configured for use in a high availability storage system.

In another implementation, a high availability storage system includes a system board. The system board includes at least one microprocessor coupled to the system board. A first circuit board region is populated with a first multi-phase voltage regulator circuit. The first multi-phase voltage regulator circuit is configured to provide electrical power to the at least one microprocessor. A second circuit board region is unpopulated and configured to receive a second multi-phase voltage regulator circuit. An enclosure is configured to house the system board.

One or more of the following features may be included. The first multi-phase voltage regulator circuit and the second multi-phase voltage regulator circuit may be produced by different manufacturers. The first circuit board region may include a first solder pad array configured to electrically couple the first multi-phase voltage regulator circuit to the system board. The second circuit board region may include a second solder pad array configured to electrically couple the second multi-phase voltage regulator circuit to the system board.

The details of one or more implementations are set forth in the accompanying drawings and the description below. Other features and advantages will become apparent from the description, the drawings, and the claims.

BRIEF DESCRIPTION OF THE DRAWINGS

FIG. 2 is a diagrammatic view of a system board included within the IT device of FIG. 1;

FIG. 2A is a diagrammatic view of one implementation of a voltage regulator circuit included within system board of FIG. 2;

FIG. 2B is a cross-sectional view of one implementation of the system board of FIG. 2.

Like reference symbols in the various drawings indicate like elements.

DETAILED DESCRIPTION OF THE PREFERRED EMBODIMENTS

Figure 1:
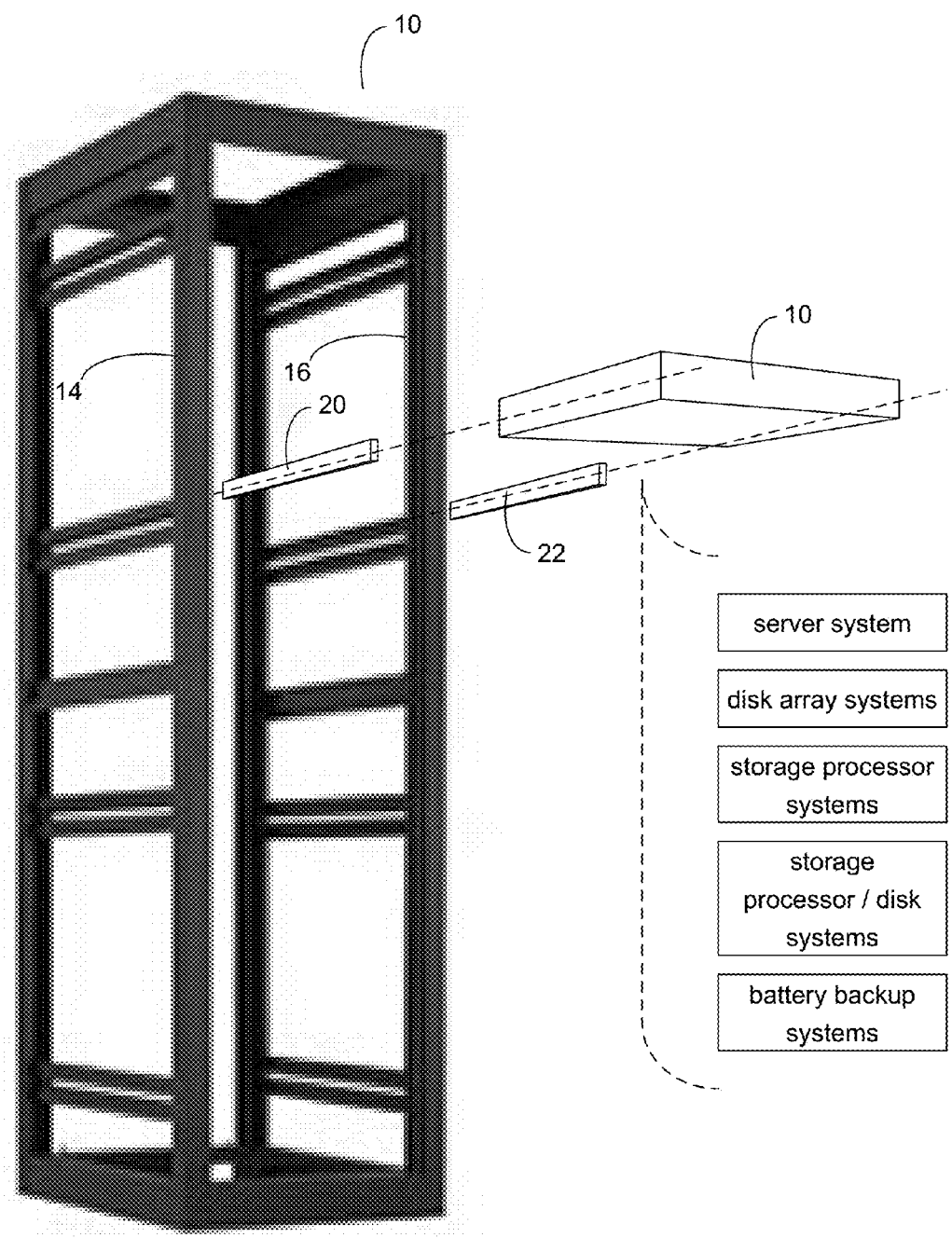
FIG. 1 is a perspective view of an IT rack and an IT device.

Referring to FIG. 1, IT devices (e.g., IT device 10) may be utilized by organizations to process and store data. Examples of IT device 10 may include but are not limited to the various components of high-availability storage systems, such as: server systems, disk array systems, storage processor systems, storage processor/disk systems, and battery backup systems.

IT racks (e.g., IT rack 12) may be utilized to store and organize these IT devices (e.g., IT device 10). For example, IT rack 12 may be placed within a computer room and various IT devices may be attached to rails (e.g., NEMA rails 14, 16) included within IT rack 12, wherein these rails (e.g., NEMA rails 14, 16) may have a standard and defined spacing between them (e.g., 19"). Typically, IT devices that are configured to fit within IT rack 12 may be described as rack-mountable IT devices. Alternatively. IT device 10 may be a free-standing device that does not require an IT rack for mounting.

Referring also to FIG. 2, positioned within IT device 10 may be one or more system boards (e.g., system board 50) that may include a plurality of circuits 52, 54, 56, 58, examples of which may include but are not limited to microprocessors, memory circuits, voltage regulator circuits, and controller circuits. As is known in the art, such circuits may be electrically coupled together via conductive traces 60 included within/etched upon system board 50. Further and as is known in the art, such system boards may be multi-layer system boards (as shown in FIG. 2A), wherein (in this example) system board 50 is shown to include six layers of conductive traces separated by five layers of non-conductive material (e.g., glass-reinforced epoxy laminate).

Assume for illustrative purposes that circuit 52 is a microprocessor and circuit 54 is a voltage regulator circuit that is configured to provide power to (among other things) microprocessor 52. An example of voltage regulator circuit 54 may include a multi-phase voltage regulator circuit. Referring also to FIG. 2B, when configured in a multi-phase fashion, voltage regulator circuit 54 may include controller 62, a plurality of switches (e.g., field effect transistors) 64 that may be used to selectively charge (via voltage source 66) and discharge a plurality of energy storage devices (e.g., capacitors) 68, wherein the output of these capacitors may be tied together to generate voltage source 70 that may power e.g., microprocessor 52. Accordingly, by varying the energizing signals (e.g., pulse-width-modulated signals) that are applied by controller 62 to switches 64, the amplitude of voltage source 70 may be varied in accordance with the needs of microprocessor 52.

Unfortunately, sometimes during the lifespan of a product, one or more of the plurality of circuits 52, 54, 56, 58 included within system board 50 may become unavailable (e.g., due to product cancellation/evolution, natural disasters, or corporate bankruptcies/mergers). As system board 50 (and the conductive traces thereon) are designed to accommodate a particular circuit, the unavailability of such a circuit may be problematic for the manufactures of system board 50, as system board 50 will need to be redesigned to accommodate a substitute circuit and then the redesigned system board will need to be subjected to the above-described testing procedures.

Figure 3:
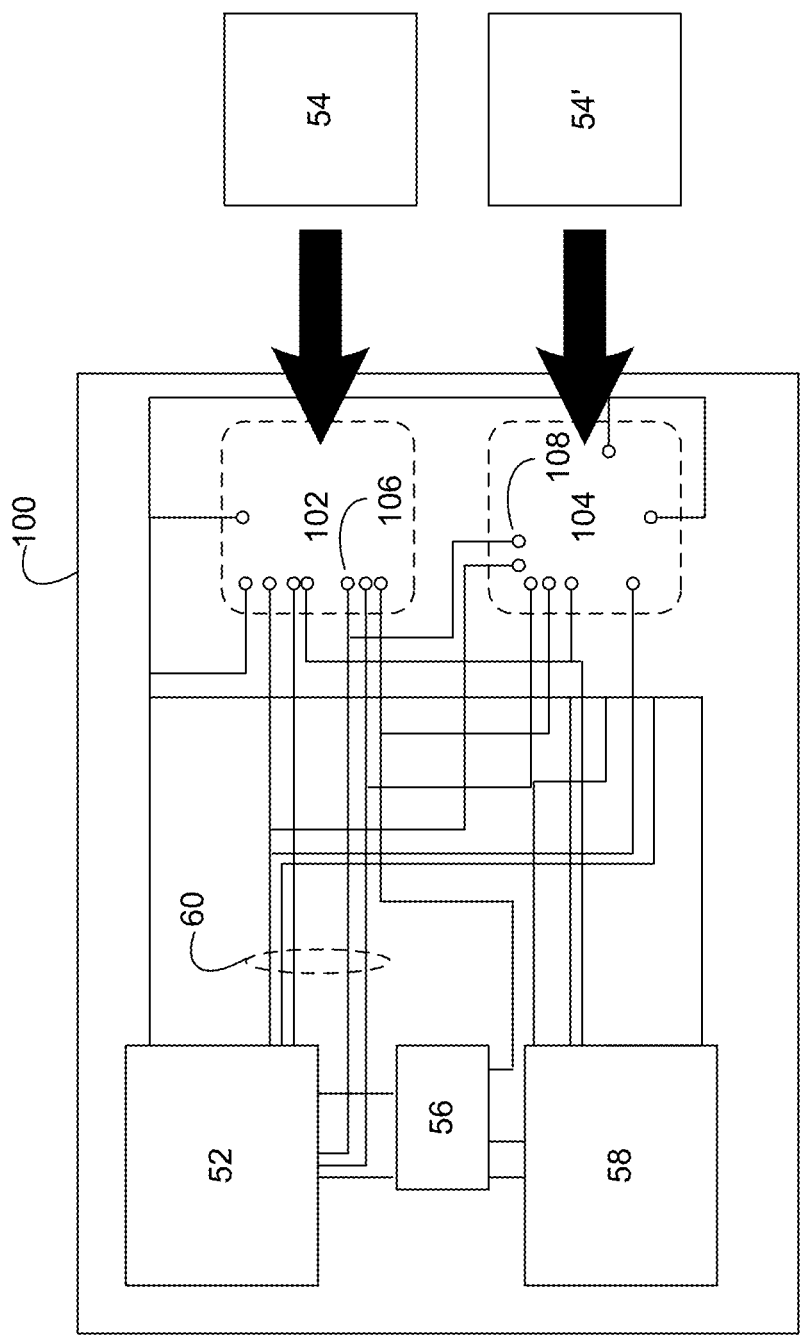
FIG. 3 is a diagrammatic view of an alternative embodiment of the system board included within the IT device of FIG. 1.

Referring also to FIG. 3, there is shown system board 100 that may be configured to accommodate a plurality of different circuits (to allow for easy circuit substitution in the event that a specific circuit becomes unavailable). For the following example, system board 100 is going to be discussed as be configured to accommodate a plurality (e.g., two) of different voltage regulator circuits. However, this is for illustrative purposes only and is not intended to be a limitation of this disclosure, as other configurations are possible and are considered to be within the scope of this disclosure. For example, the level of circuit redundancy of system board 100 may be increased if desired (e.g., system board 100 may be designed to accommodate four different voltage regulator circuits).

System board 100 may include at least one microprocessor (e.g., microprocessor 52) coupled to system board 100. A first circuit board region (e.g., first circuit board region 102) may be populated with a first model voltage regulator circuit (e.g., voltage regulator circuit 54). As discussed above, this first model voltage regulator circuit (e.g., voltage regulator circuit 54) may be configured to provide electrical power to the at least one microprocessor (e.g., microprocessor 52). A second circuit board region (e.g., second circuit board region 104) may be unpopulated but may be configured to receive a second model voltage regulator circuit (e.g., voltage regulator circuit 54'). The first model voltage regulator circuit (e.g., voltage regulator circuit 54) and the second model voltage regulator circuit (e.g., voltage regulator circuit 54') may be produced by different manufacturers, thus reducing the likelihood that both the first model voltage regulator circuit (e.g., voltage regulator circuit 54) and the second model voltage regulator circuit (e.g., voltage regulator circuit 54') would become simultaneously unavailable.

First circuit board region 102 may include a first solder pad array (e.g., first pad array 106) configured to electrically couple the first model voltage regulator circuit (e.g., voltage regulator circuit 54) to system board 100. Specifically, the solder pads included within first pad array 106 may be configured and positioned on system board 100 so that they engage and electrically couple the pins (not shown) of voltage regulator circuit 54 with conductive traces 60 on system board 100.

Second circuit board region 104 may include a second solder pad array (e.g., second pad array 108) configured to electrically couple the second model voltage regulator circuit (e.g., voltage regulator circuit 54') to system board 100. Specifically, the solder pads included within second pad array 108 may be configured and positioned on system board 100 so that they engage and electrically couple the pins (not shown) of voltage regulator circuit 54' with conductive traces 60 on system board 100.

Accordingly and when designed, system board 100 may be configured and tested to ensure that system board 100 functions properly with either the first model voltage regulator circuit (e.g., voltage regulator circuit 54) installed within first circuit board region 102 or the second model voltage regulator circuit (e.g., voltage regulator circuit 54') installed within second circuit board region 104. Therefore, system board 100 (when manufactured) may be populated and shipped with the first model voltage regulator circuit (e.g., voltage regulator circuit 54) installed within first circuit board region 102.

In the event that the first model voltage regulator circuit (e.g., voltage regulator circuit 54) becomes unavailable (e.g., due to a tsunami destroying the factory that manufactures voltage regulator circuit 54), subsequently-manufactured versions of system board 100 may be populated and shipped with the second model voltage regulator circuit (e.g., voltage regulator circuit 54') installed within second circuit board region 104. As discussed above, since system board 100 was previously configured and tested to ensure that it functioned properly with either voltage regulator circuit 54 or voltage regulator circuit 54', first circuit board region 102 may be left unpopulated and second circuit board region 104 may be populated with the second model voltage regulator circuit (e.g., voltage regulator circuit 54').

Further and as discussed above, the first model voltage regulator circuit (e.g., voltage regulator circuit 54) and/or the second model voltage regulator circuit (e.g., voltage regulator circuit 54') may be a multi-phase voltage regulator circuit. As discussed above, if the first model voltage regulator circuit (e.g., voltage regulator circuit 54) and/or the second model voltage regulator circuit (e.g., voltage regulator circuit 54') is a multi-phase voltage regulator circuit, the first model voltage regulator circuit (e.g., voltage regulator circuit 54) and/or the second model voltage regulator circuit (e.g., voltage regulator circuit 54') may include a plurality of transistors (e.g., switches 58; FIG. 2B) and a plurality of capacitors (e.g., energy storage devices 62, FIG. 2B) for powering microprocessor 52.

Having thus described the disclosure of the present application in detail and by reference to embodiments thereof, it will be apparent that modifications and variations are possible without departing from the scope of the disclosure defined in the appended claims.

What is claimed is:

1. A system board comprising:
   at least one microprocessor coupled to the system board;
   a first circuit board region populated with a first model voltage regulator circuit, wherein the first model voltage regulator circuit is configured to provide electrical power to the at least one microprocessor using one or more conductive traces; and
   a second circuit board region unpopulated and configured to receive a second model voltage regulator circuit, wherein the second model voltage regulator circuit, when populated, is further configured to provide electrical power to the at least one microprocessor using the one or more conductive traces via the second circuit board region, wherein the one or more conductive traces electrically couple together the first model voltage regulator circuit at the first circuit board region and the second model voltage regulator circuit at the second circuit board region.

2. The system board of claim 1 wherein the first model voltage regulator circuit is a first multi-phase voltage regulator circuit.

3. The system board of claim 2 wherein the first multi-phase voltage regulator circuit includes a plurality of transistors and a plurality of capacitors.

4. The system board of claim 1 wherein the second model voltage regulator circuit is a second multi-phase voltage regulator circuit.

5. The system board of claim 4 wherein the second multi-phase voltage regulator circuit includes a plurality of transistors and a plurality of capacitors.

6. The system board of claim 1 wherein the first model voltage regulator circuit and the second model voltage regulator circuit are produced by different manufacturers.

7. The system board of claim 1 wherein the first circuit board region includes a first solder pad array configured to electrically couple the first model voltage regulator circuit to the system board.

8. The system board of claim 1 wherein the second circuit board region includes a second solder pad array configured to electrically couple the second model voltage regulator circuit to the system board.

9. The system board of claim 1 wherein the system board is configured for use in a high availability storage system.

10. A system board comprising:
    at least one microprocessor coupled to the system board;
    a first circuit board region populated with a first multi-phase voltage regulator circuit, wherein the first multi-phase voltage regulator circuit is configured to provide electrical power to the at least one microprocessor using one or more conductive traces; and
    a second circuit board region unpopulated and configured to receive a second multi-phase voltage regulator circuit, wherein the second multi-phase voltage regulator circuit, when populated, is further configured to provide electrical power to the at least one microprocessor using the one or more conductive traces via the second circuit board region, wherein the one or more conductive traces electrically couple together the first multi-phase voltage regulator circuit at the first circuit board region and the second multi-phase voltage regulator circuit at the second circuit board region.

11. The system board of claim 10 wherein the first multi-phase voltage regulator circuit includes a plurality of transistors and a plurality of capacitors.

12. The system board of claim 10 wherein the second multi-phase voltage regulator circuit includes a plurality of transistors and a plurality of capacitors.

13. The system board of claim 10 wherein the first multi-phase voltage regulator circuit and the second multi-phase voltage regulator circuit are produced by different manufacturers.

14. The system board of claim 10 wherein the first circuit board region includes a first solder pad array configured to electrically couple the first multi-phase voltage regulator circuit to the system board.

15. The system board of claim 10 wherein the second circuit board region includes a second solder pad array configured to electrically couple the second multi-phase voltage regulator circuit to the system board.

16. The system board of claim 10 wherein the system board is configured for use in a high availability storage system.

17. A high availability storage system comprising:
    a system board including:
       at least one microprocessor coupled to the system board,
       a first circuit board region populated with a first multi-phase voltage regulator circuit, wherein the first multi-phase voltage regulator circuit is configured to provide electrical power to the at least one microprocessor using one or more conductive traces, and
       a second circuit board region unpopulated and configured to receive a second multi-phase voltage regulator circuit, wherein the second multi-phase voltage regulator circuit, when populated, is further configured to provide electrical power to the at least one microprocessor using the one or more conductive traces via the second circuit board region, wherein the one or more conductive traces electrically couple together the first multi-phase voltage regulator circuit at the first circuit board region and the second multi-phase voltage regulator circuit at the second circuit board region; and
    an enclosure configured to house the system board.

18. The high availability storage system of claim 17 wherein the first multi-phase voltage regulator circuit and the second multi-phase voltage regulator circuit are produced by different manufacturers.

19. The high availability storage system of claim 17 wherein the first circuit board region includes a first solder pad array configured to electrically couple the first multi-phase voltage regulator circuit to the system board.

20. The high availability storage system of claim 17 wherein the second circuit board region includes a second solder pad array configured to electrically couple the second multi-phase voltage regulator circuit to the system board.

* * * * *